(12) United States Patent
Osinski et al.

(10) Patent No.: US 10,320,149 B2
(45) Date of Patent: Jun. 11, 2019

(54) LIGHT-EMITTING DEVICE HAVING III-V SEMICONDUCTOR GAIN SECTION COUPLED TO WHISTLE-GEOMETRY TUNABLE FILTER

(71) Applicants: INSTITUT MINES-TELECOM, Paris (FR); UNIVERSITY OF NEW MEXICO, Albuquerque, NM (US)

(72) Inventors: Marek Osinski, Albuquerque, NM (US); Frédéric Grillot, Versailles (FR)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 15/741,230

(22) PCT Filed: Jun. 29, 2016

(86) PCT No.: PCT/EP2016/065125
§ 371 (c)(1),
(2) Date: Dec. 29, 2017

(87) PCT Pub. No.: WO2017/001466
PCT Pub. Date: Jan. 5, 2017

(65) Prior Publication Data
US 2018/0191134 A1  Jul. 5, 2018

(30) Foreign Application Priority Data
Jul. 1, 2015  (EP) .................................... 15174743

(51) Int. Cl.
*H01S 5/10*  (2006.01)
*H01S 5/06*  (2006.01)
(Continued)

(52) U.S. Cl.
CPC .......... *H01S 5/1028* (2013.01); *H01S 5/0228* (2013.01); *H01S 5/068* (2013.01);
(Continued)

(58) Field of Classification Search
CPC ...... H01S 5/1028; H01S 5/3434; H01S 5/068; H01S 5/101; H01S 5/34313; H01S 5/125;
(Continued)

(56) References Cited

U.S. PATENT DOCUMENTS

| 5,327,448 A | 7/1994 | Holonyak, Jr. et al. |
| 5,398,256 A | 3/1995 | Hohimer et al. |
| 2008/0198888 A1 | 8/2008 | Arimoto |

FOREIGN PATENT DOCUMENTS

EP  1708323 A2  4/2006

OTHER PUBLICATIONS

Duan Guang-Hua: "Hybrid III-V on silicon lasers for photonic integrated circuits on silicon", Proceedings of the SPIE, vol. 9002, Feb. 27, 2014, pp. 90020X-90020X, XP060035214.*

(Continued)

*Primary Examiner* — Armando Rodriguez
(74) *Attorney, Agent, or Firm* — Vogt IP; Keith A. Vogt

(57) ABSTRACT

The invention concerns a wavelength tunable semiconductor laser comprising a laser gain section (510) optically coupled to an underlying optical waveguide (520). According to an embodiment of the invention, a first and a second passive microring resonators (530, 560) having a whistle geometry, are arranged on both sides of the laser gain section and evanescently coupled with the optical waveguide (520). Highly reflective broadband mirrors (541, 571) are provided at the free ends of optical waveguide branches (240, 270) tangentially connected to the microring resonators. The first and second passive microrings resonators provide an optical feedback to the laser gain section and allow to select the desired wavelength. The laser structure can be implemented according to a III-V/Si technology.

20 Claims, 7 Drawing Sheets

(51) Int. Cl.
    *H01S 5/14*    (2006.01)
    *H01S 5/022*   (2006.01)
    *H01S 5/068*   (2006.01)
    *H01S 5/125*   (2006.01)
    *H01S 5/343*   (2006.01)
    *H01S 5/02*    (2006.01)

(52) U.S. Cl.
    CPC ............ *H01S 5/0612* (2013.01); *H01S 5/101* (2013.01); *H01S 5/1032* (2013.01); *H01S 5/125* (2013.01); *H01S 5/142* (2013.01); *H01S 5/3434* (2013.01); *H01S 5/34313* (2013.01); *H01S 5/021* (2013.01); *H01S 5/0215* (2013.01); *H01S 5/0224* (2013.01); *H01S 5/02248* (2013.01)

(58) Field of Classification Search
    CPC .... H01S 5/0228; H01S 5/1032; H01S 5/0612; H01S 5/142; H01S 5/021; H01S 5/02248; H01S 5/0224; H01S 5/0215
    See application file for complete search history.

(56) References Cited

OTHER PUBLICATIONS

Bakir et al; Electrically driven hybrid Si/III-V Fabry-Pérot lasers based on adiabatic mode transformers; May 23, 2011; 9 pages; Optics Express, vol. 19, No. 11; The Optical Society; OSA Publishing; Washington, DC.

Camacho-Aguilera; An electrically pumped germanium laser; May 7, 2012; 5 pages; Optics Express, vol. 20, No. 10; The Optical Society; OSA Publishing; Washington, DC.

Fang et al; Single-Wavelength Silicon Evanescent Lasers; IEEE Journal of Selected Tops in Quantum Electronics, vol. 15, No. 3; May/Jun. 2009; 10 pages; IEEE; US.

Fang et al; Electrically pumped hybrid AlGaInAs-silicon evanescent laser; Oct. 2, 2006; Optics Express, vol. 14, No. 20; 8 pages; The Optical Society; OSA Publishing; Washington, DC.

Keyvaninia et al; Demonstration of a heterogeneously integrated III-V/SOI single wavelength tunable laser; Feb. 11, 2013; Optics Express; vol. 21, No. 3; 9 pages; The Optical Society; OSA Publishing; Washington, DC.

Keyvaninia et al; III-V-on-silicon multi-frequency lasers; Jun. 3, 2013; Optics Express; vol. 21, No. 11; 9 pages; The Optical Society; OSA Publishing; Washington, DC.

Koehl et al; Integrated Silicon Photonics: Harnessing the Data Explosion; Mar. 2011; OPN Optics & Photonics News; The Optical Society; OSA Publishing; Washington, DC.

Lamponi et al; Heterogeneously integrated InP/SOI laser using double tapered single-mode waveguides through adhesive die to wafer bonding; no month, 2010; IEEE; US.

Lamponi et al; Low-Threshold Heterogeneously Integrated InP/SOI Lasers With a Double Adiabatic Taper Coupler; IEEE Photonics Technology Letters, Vo. 24, No. 1; Jan. 1, 2012; 3 pages; IEEE, US.

Liu et al; Passive microring-resonator-coupled lasers; Applied Physics Letters; vol. 29, No. 22; Nov. 26, 2001; American Institute of Physics; US.

Liu et al; Wide Tunable Double Ring Resonator Coupled Lasers; IEEE Photonics Technology Letters; vol. 14, No. 5; May 2002; 3 pages; IEEE; US.

Matsuo; Microring-Resonator-Based Widely Tunable Lasers; IEEE Journal of Selected Topics in Quantum Electronics; 10 pages; vol. 15, No. 3, May/Jun. 2009; IEEE; US.

Park et al; Device and Integration Technology for Silicon Photonic Transmitters; IEEE Journal of Selected Topics in Quantum Electronics; 18 pages; vol. 17, No. 3, May/Jun. 2011; IEEE; US.

Roelkens et al; Laser emission and photodetection in an InP/InGaAsP layer integrated on and coupled to a Silicon-on-Insulator waveguide circuit; Sep. 4, 2006; 6 pages; vol. 14, No. 18; Optics Express; The Optical Society; OSA Publishing; Washington, DC.

Roelkens et a; III-V/silicon photonics for on-chip and inter-chip optical interconnects; Laser Photonics; 29 pages; Rev. 4, No. 6, 751-779 (2010); Wiley-VCH Verlag GmbH & Co. KGaA, Weinheim; DE.

Bogaerts et al; Silicon-on-Insulator Spectral Filters Fabricated With CMOS Technology; IEEE Journal Of Selected Topics In Quantum Electronics, 12 pages; vol. 16, No. 1, Jan./Feb. 2010; IEEE; US.

Stankovic et al; 1310-nm Hybrid III—V/Si Fabry—Pérot Laser Based on Adhesive Bonding; IEEE Photonics Technology Letters, 3 pages; vol. 23, No. 23, Dec. 1, 2011; IEEE; US.

Sun et al; Electrically Pumped Supermode Si/InGaAsP Hybrid Lasers; 2 page; CLEO Conference; 2010; IEEE; US.

Osmond et al; 40 Gb/s surface-illuminated Ge—on-Si photodetectors; Applied Physics Letters 95; 4 pages; 2009; American Institute of Physics; US.

Watts; et al; Vertical junction silicon microdisk modulators and switches; Oct. 24, 2011; Optics Express; vol. 19, No. 22; 15 pages; The Optical Society; OSA Publishing; Washington, DC.

Zheng; et al; Electrically pumped heterogeneously integrated Si/III-V evanescent lasers with micro-loop mirror reflector; Applied Physics Letters; 99, 011103 (2011); American Institute of Physics; US.

European Patent Office; International Search Report & Written Opinion for PCT/EP2016/065125; 14 pages; Rijswik, NL European Patent Office; International Preliminary Report on Patentability for PCT/EP2016/065125; Jan. 6, 2017; 10 pages; Munich, DE.

* cited by examiner

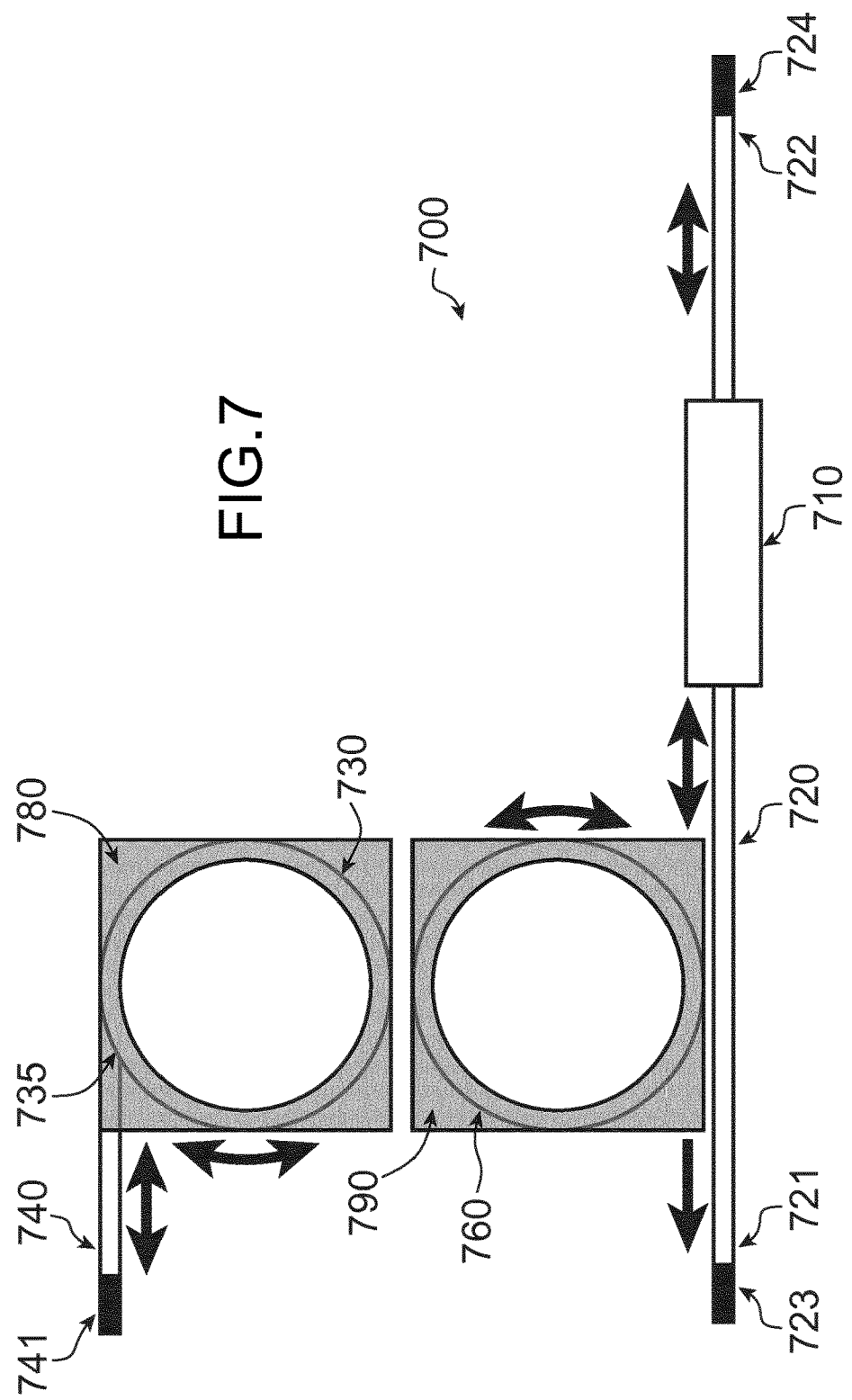

LIGHT-EMITTING DEVICE HAVING III-V SEMICONDUCTOR GAIN SECTION COUPLED TO WHISTLE-GEOMETRY TUNABLE FILTER

FIELD OF THE INVENTION

The present invention relates to the field of wavelength tunable semiconductor lasers, and more particularly, of tunable hybrid silicon/III-V lasers.

BACKGROUND OF THE INVENTION

Various techniques are known for tuning the wavelength of a semiconductor laser.

A common approach for tuning the wavelength of a semiconductor laser is based on current injection into the optical cavity. However, this technique does not provide a wide tuning range due to the limitation on the maximum refractive index change that can be induced by current injection. In addition, current tuning is accompanied by large changes in the optical output power, which is often not desirable.

In order to enhance the tuning range of a semiconductor laser without large changes in the optical output power, it has been proposed to use passive microring resonators outside the laser active region.

Microring resonators are known for their small size, high quality factor Q, transparency to off-resonance light, and absence of intrinsic reflections.

A first tunable laser structure using microring resonators has been proposed in the article by S. Matsuo et al. entitled "Microring-resonator-based widely tunable lasers" published in IEEE Journal of Selected Topics in Quantum Electronics, vol. 15, No. 3, May/June 2009, pp. 545-554, which discloses a double-ring resonator tunable laser (DDR-TL). This structure comprises an active region and a filter region. The active region is in the center of the device and provides the optical gain. The filter region comprises two passive microrings which are coupled to the gain region of the laser. The two microrings act as filters, having each a comb-like frequency response with different free spectral ranges (FSRs). Only light at the common resonant frequency of both microrings can be amplified. The lasing frequency can be selected by controlling the resonant frequency of the ring resonators according to the Vernier effect.

More recently, a second tunable laser structure using microring resonators has been proposed in the article by Po Dong et al. entitled "Silicon photonic devices and integrated circuits" published in Nanophotonics 2014, Vol. 3, No. 4-5, pp. 215-228.

The latter laser structure, 100, is schematically represented in FIG. 1. It comprises a III-V semiconductor gain section (for example made of InP-based materials), 110, integrated and coupled with a first silicon waveguide, 120, having a first end, 121, and a second end, 122.

A first microring resonator in silicon, 130, is arranged between the first end 121 and the gain section 110. The microring resonator 130 is evanescently coupled, 123, with the first silicon waveguide 120 and with a second silicon waveguide, 140, arranged in parallel with the first silicon waveguide.

Similarly, a second microring resonator in silicon, 150, is arranged between the gain section 110 and the second end 122 of the first silicon waveguide 120. The second microring resonator is also evanescently coupled, 124, with the first silicon waveguide and with a third silicon waveguide, 160, arranged in parallel with the first silicon waveguide.

The second silicon waveguide 140 comprises a proximal end, 141, provided with a first Bragg reflector, and a distal open end, 142. Similarly, the third silicon waveguide 160 comprises a proximal end, 161, provided with a second Bragg reflector and a distal open end, 162.

The light output leftwards from the gain section 110 is partially injected via evanescent coupler 123 into the first microring resonator 130 to give rise to a first clockwise propagating wave. This wave is then coupled into the second silicon waveguide 140 to give rise to a rightwards propagating wave. The rightwards propagating wave is reflected by the first Bragg reflector 141 back into the first microring resonator 130, where it gives rise to a first counterclockwise propagating wave.

Similarly, the light output rightwards from the gain section 110 is partially injected by evanescent coupling 124 into the second microring resonator 150 to give rise to a second counterclockwise propagating wave. This wave is then coupled into the third silicon waveguide 160 to give rise to a leftward-propagating wave. The leftward-propagating wave is reflected by the second Bragg reflector 161 back into the second microring resonator 150, where it gives rise to a second clockwise propagating wave.

The second end 122 of the first silicon waveguide is provided with a Bragg grating to output light vertically e.g. into an optical fiber (not shown), using for example the approach described by G. Roelkens et al. in the article entitled "Grating-based optical fiber interfaces for silicon-on-insulator photonic integrated circuits" published in IEEE Journal of Selected Topics in Quantum Electronics 2011, Vol. 17, No. 3, pp. 571-580.

The first and second microring resonators have slightly different radii and thus exhibit comb-like frequency responses with slightly different FSRs. Heaters, 180, 190, respectively provided on the first and the second microring resonators, slightly modify the resonant frequencies due to temperature dependence of the refractive index. The Vernier effect between the two frequency combs can be used for tuning the wavelength of the laser, the wavelength being selected by the overlap between the two frequency combs.

The silicon waveguides are typically obtained by patterning an SOI wafer. The InP-based gain section is obtained by growing a stack of epitaxial layers on an InP wafer and by bonding the unprocessed InP wafer, epitaxial layers down, onto the patterned SOI wafer. After bonding, the InP substrate is removed and the diode lasers can be fabricated using conventional wafer-scale processing, and lithographically aligned to the underlying SOI pattern.

However, the laser structure shown on FIG. 1 is unstable under normal operating conditions. In particular, experiments have demonstrated that the laser structure was prone to mode jumps and chaotic oscillations. Furthermore, the efficiency of the laser is rather poor and therefore the light output power quite low.

The purpose of the present application is therefore to provide a wavelength tunable semiconductor laser remedying the shortcomings recited above. In particular, the main object of the present invention is to propose a wavelength tunable semiconductor laser structure which exhibits a very high degree of stability and high efficiency.

BRIEF DESCRIPTION OF THE INVENTION

The present invention is defined in the appended independent claims. Various advantageous embodiments are defined in the dependent claims.

BRIEF DESCRIPTION OF THE DRAWINGS

The present invention will be better understood from the description of the following embodiments, by way of illustration and in no way limitative thereto:

FIG. 7 schematically illustrates the structure of a tandem WGF/ring-resonator wavelength tunable semiconductor laser according to a third embodiment of the invention.

DETAILED DISCLOSURE OF PARTICULAR EMBODIMENTS

Figure 1:
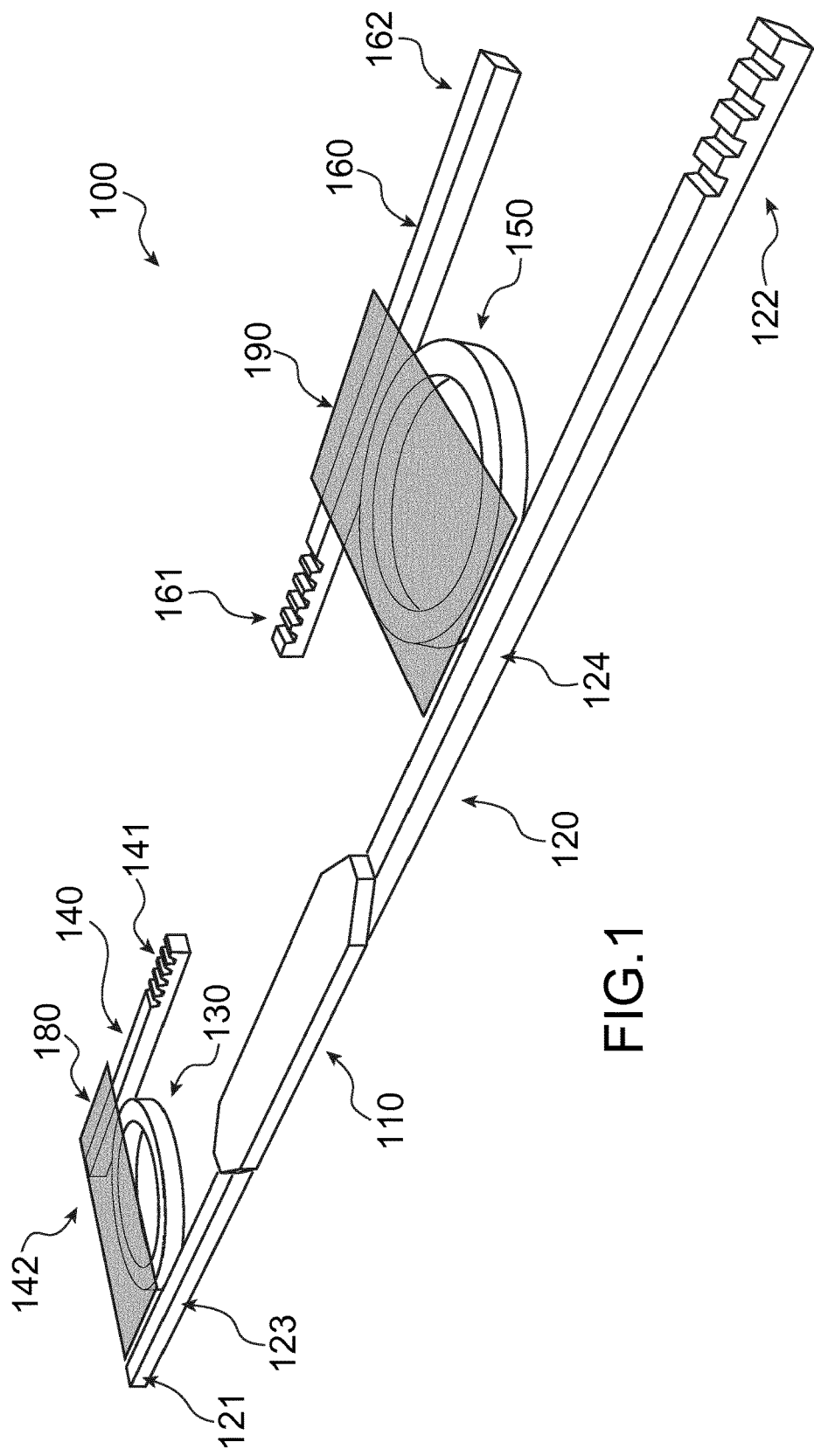
FIG. 1 schematically illustrates the structure of a wavelength tunable semiconductor laser, as known from the prior art.

The idea underlying the invention is to provide a higher efficiency wavelength tunable semiconductor laser structure with very little stray light directed out of the composite laser cavity. It has indeed been recognized that the stray light reflected on the cleaved distal ends of the second and third waveguides causes chaotic mode jumps in the laser structure illustrated in FIG. 1.

Figure 2:
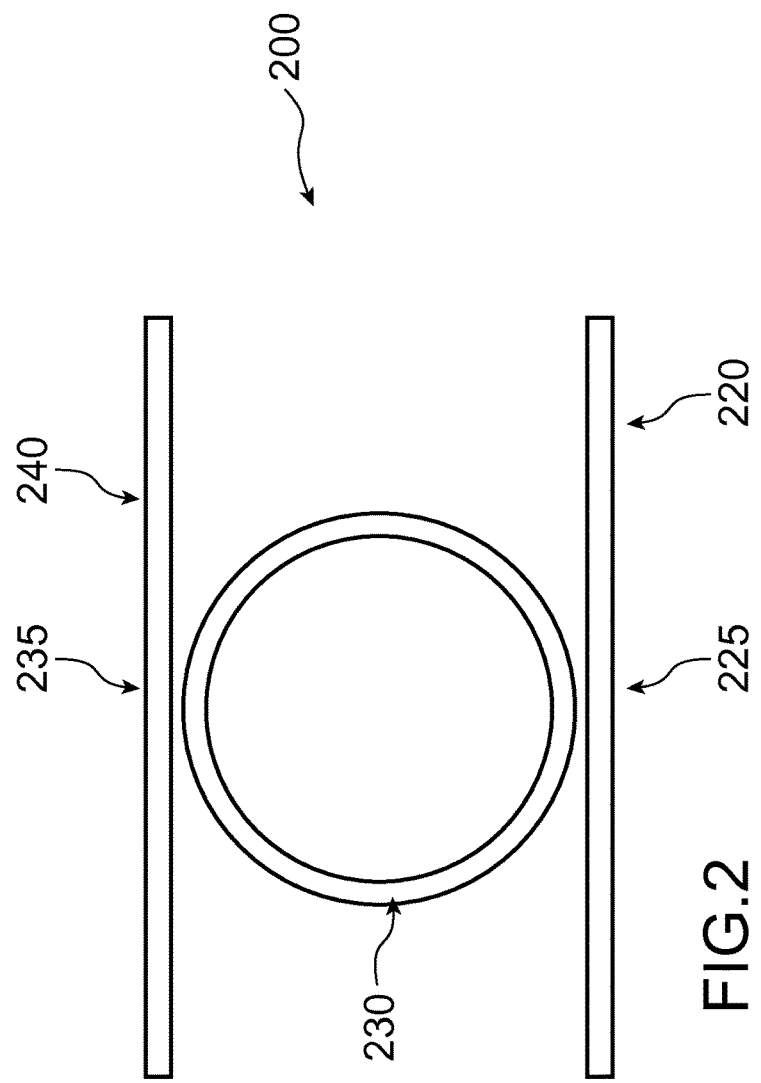
FIG. 2 schematically illustrates the structure of a 4-port ring resonator filter, as known from the prior art.
Figure 3:
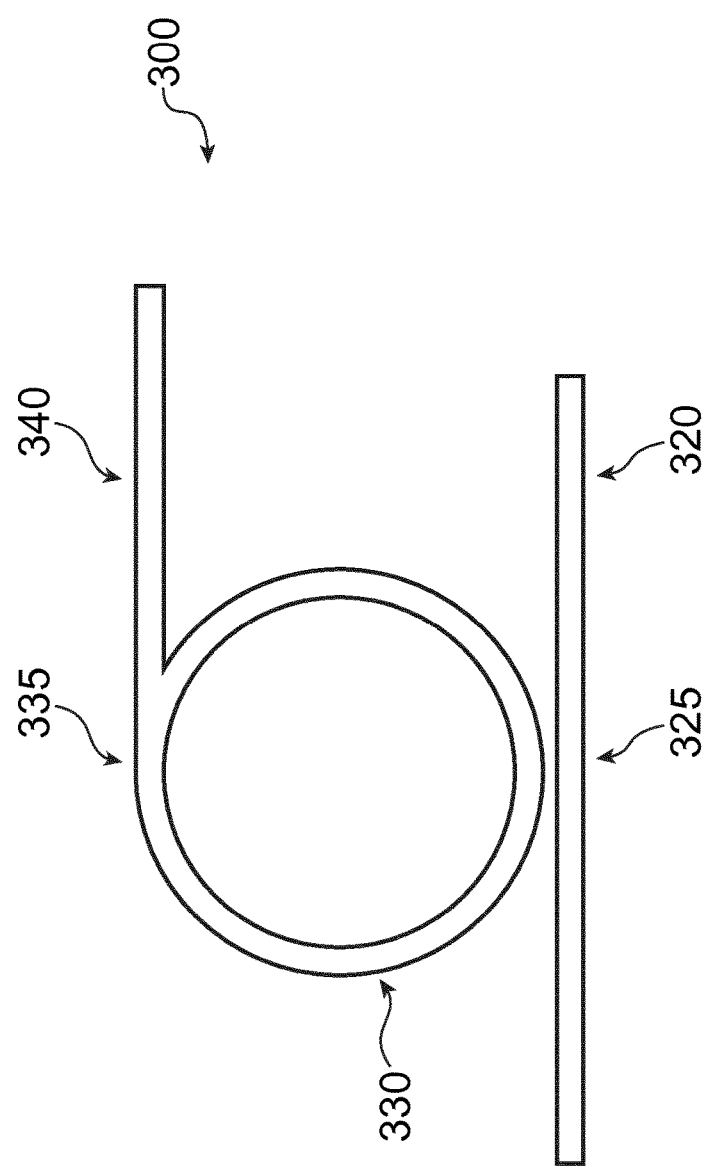
FIG. 3 schematically illustrates the structure of a 3-port whistle-geometry ring resonator filter (WGF), useful to an embodiment of the invention.

The key element of the present invention lies in replacing a standard 4-port ring resonator filter, 200, shown schematically in FIG. 2, with a whistle-geometry filter (WGF), 300, shown in FIG. 3. The standard 4-port ring resonator filter is symmetric, with equal probabilities of transmission and reflection no matter which port is treated as input. Two waveguides, 220 and 240, are coupled to a ring resonator, 230, via evanescent couplers, 225 and 235, respectively, and are arranged symmetrically at two opposite sides of the ring resonator 230.

In contrast, the WGF configuration introduces a strong asymmetry between the ports, resulting in a strong coupling of the light circulating in a ring resonator, 330, into and out of a first waveguide, 340. The evanescent coupler section 235 is replaced with a tangential coupler, 335, whereby the first waveguide 340 goes directly into the ring resonator 330. This feature changes dramatically the efficiency of coupling the light into and out of the ring resonator 330 at the side of the waveguide 340. The arrangement of a second waveguide, 320, with respect to the ring resonator 330, remains essentially the same as in FIG. 2, with an evanescent coupler, 325, between the second waveguide 320 and the ring resonator 330.

Figure 4:
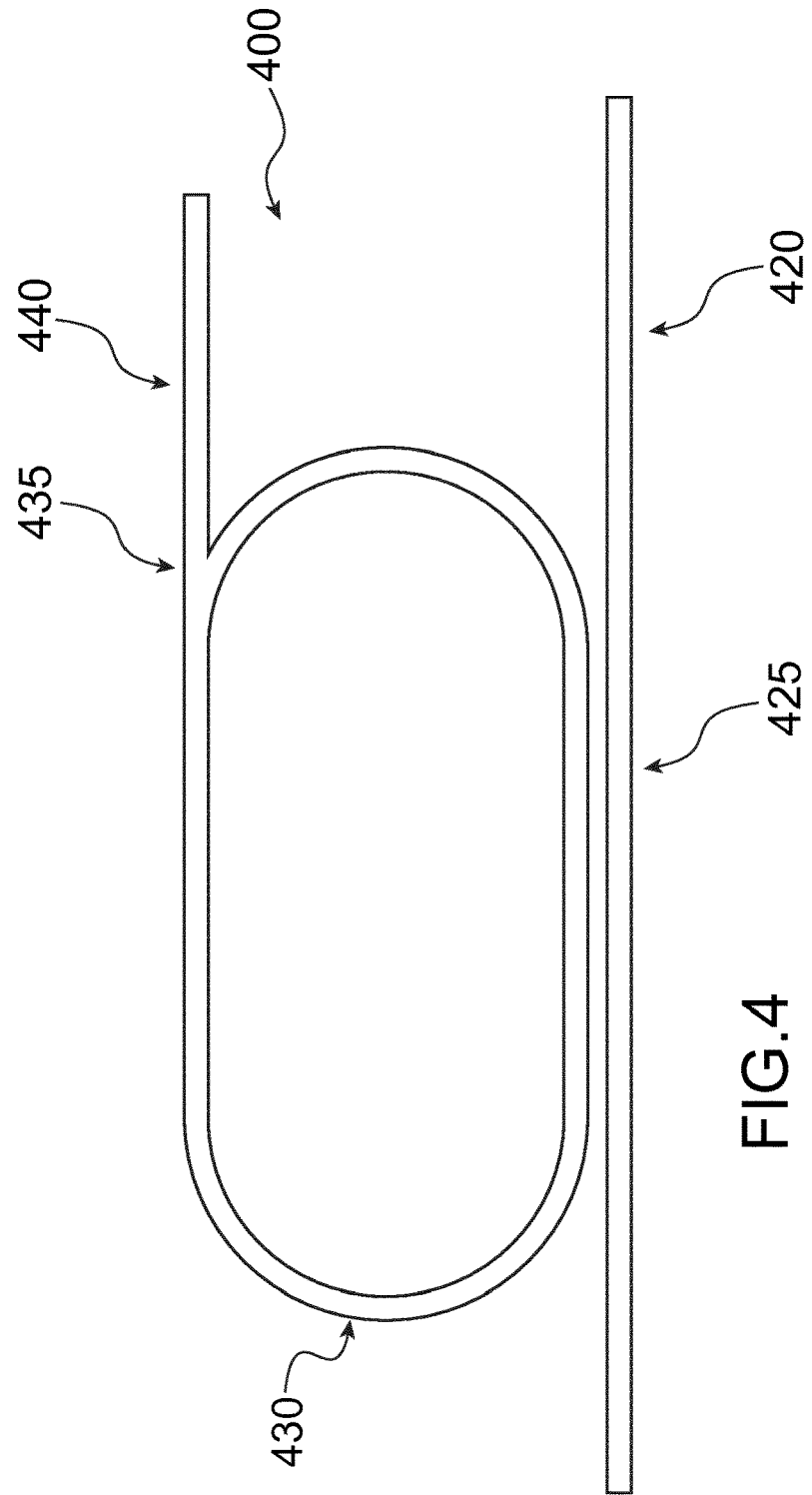
FIG. 4 schematically illustrates the structure of a 3-port whistle-geometry racetrack resonator filter, useful to an embodiment of the invention.

For a better control of coupling between the ring resonator and the waveguides, another embodiment of the WGF, 400, can have a racetrack-shaped ring resonator, as illustrated in FIG. 4.

A first waveguide, 440, goes directly into a straight section, 435, of a racetrack resonator waveguide, 430. Optical coupling between a second waveguide, 420, and the racetrack ring resonator 430 via a directional coupler, 425, is easier to control than the evanescent coupling between the circular ring resonator 330 and the waveguide 320 in FIG. 3.

Figure 5:
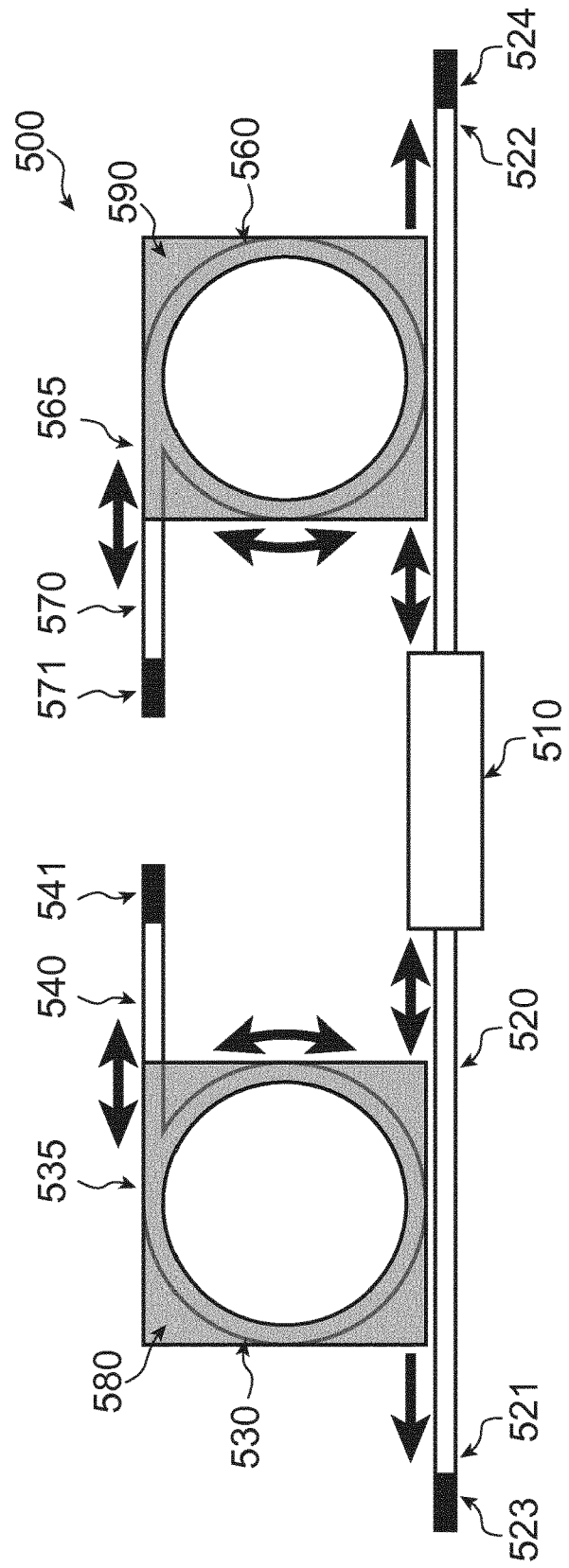
FIG. 5 schematically illustrates the structure of a double-WGF wavelength tunable semiconductor laser according to a first embodiment of the invention.

FIG. 5 schematically illustrates the structure of a double-WGF wavelength tunable semiconductor laser according to a first embodiment of the invention.

The illustrated semiconductor laser, 500, comprises a laser gain section, 510, performing an optical amplification. The detailed structure of this section is described further below.

The laser gain section 510 is optically coupled to an optical waveguide, 520, having a first end, 521, and a second end, 522, the laser light being output at both ends through a first mirror, 523, and a second mirror, 524, for example Bragg reflectors. A configuration in which one of the two mirrors 523 or 524 is highly reflective is also possible. By highly reflective, it is meant that the mirror reflectivity is at least 60%.

A first passive microring resonator, 530, is located between the laser gain section 510 and the first end 521 of the optical waveguide 520. The first microring resonator 530 is extended by a first optical waveguide branch, 540, which is tangentially connected, 535, to the first microring resonator 530, according to a whistle geometry. The first optical waveguide branch 540 is provided at its free (unconnected) end with a third mirror, 541, for example a highly reflective broadband Bragg reflector. By broadband, it is meant that the mirror reflectivity remains high (i.e., is at least 60%) over the entire range of wavelengths at which the laser can operate.

Similarly, a second passive microring resonator, 560, is located between the laser gain section 510 and the second end 522 of the optical waveguide. The second microring resonator 560 is extended by a second optical waveguide branch, 570, which is tangentially connected to the second microring resonator 560 according to a whistle geometry. The second optical waveguide branch 570 is provided at its free (unconnected) end with a fourth mirror, 571, for example a highly reflective broadband Bragg reflector, within the meaning defined above.

The first and the second optical waveguide branches 540 and 570 are preferably straight branches.

The first 540 (resp. second 570) optical waveguide branch is connected to the first 530 (resp. second 560) microring resonator via a tangential connection, 535 (resp., 565). By tangential connection, it is meant that the center line of the optical waveguide branch is aligned with a tangent to the mid-circle of the microring resonator. When the resonator 530 (resp. 560) and the optical waveguide branch 540 (resp. 570) are implemented by optical fibers, the core of the resonator is aligned and fused with the core of the optical waveguide branch. Off-axis tangential coupling is also possible, to provide a better matching between the modes of the straight waveguide 540 (resp. 570) and the circular resonator 530 (resp. 560). In the off-axis coupling, the peaks of the intensity distributions of the modes, rather than geometrical axes of the waveguides, are aligned.

The first 530 and the second 560 passive microring resonators are evanescently coupled to the optical waveguide 520 on either side of the laser gain section. By evanescent coupling, it is meant that the microring resonators are located close to the optical waveguide, so that an evanescent wave from the optical waveguide may enter the microring resonators and vice-versa.

The light wave emitted by the laser gain section 510, travelling towards the first end 521, is injected into the first microring resonator 530 by evanescent coupling. The light wave thus injected travels clockwise in the first microring resonator 530 and a part thereof is further injected into the first optical waveguide branch 540 via the tangential connection 535. The wave injected into the first optical waveguide branch 540 is reflected by the third mirror 541 back into the first microring resonator 530, where the reflected wave travels counterclockwise. A part of the reflected wave is injected by evanescent coupling into the optical waveguide 520 and fed back into the laser gain section 510.

Similarly, the light wave emitted by the laser gain section 510, travelling towards the second end 522, is injected into the second microring resonator 560 by evanescent coupling. The light wave thus injected travels counterclockwise in the second microring resonator 560 and a part thereof is further injected into the second optical waveguide branch 570 via the tangential connection 565. The wave injected into the second optical waveguide branch 570 is reflected by the fourth mirror 571 back into the second microring resonator 560, where the reflected wave travels clockwise. A part of the reflected wave is injected by evanescent coupling into the optical waveguide 520 and fed back to the laser gain section 510.

When the first 530 and the second 560 microring resonators have a whistle geometry according to FIG. 3, the microrings have preferably slightly different diameters and therefore exhibit different FSRs. Similarly, if the first 530 and the second 560 microring resonators have a whistle geometry according to FIG. 4, the optical lengths of the respective racetrack resonators are preferably different (e.g. the lengths of their respective straight portions may be different). In both cases, the wavelength can be selected by the Vernier effect, with only the wavelength corresponding to a match of the respective comb-like frequency responses of the resonators being amplified.

The first 530 and/or second 560 microring resonators are preferably provided with ohmic heater(s) 580, and/or 590, configured to heat the first 530 and/or second 560 microring resonator(s). It is therefore possible to vary the optical path length(s) of either or both microring resonators by controlling the currents flowing through the respective heater(s), and hence to tune the wavelength of the laser. Alternatively, in particular when the microring resonators 530, 560 are made of a semiconductor material (as silicon for example), the optical path lengths of the microring resonators can be varied by driving a current through them.

The laser structure depicted in FIG. 5 is preferably implemented according to a III-V/Si photonics technology.

In such instance, a silicon layer is deposited on top of a $SiO_2$ layer grown on a Si substrate. The optical waveguide 520, the passive microring resonators 530, 560, including their branch extensions 540, 570, are patterned in the silicon layer to form a rib waveguide circuit.

The heaters 580, 590 can be implemented by patches of metallic or resistive materials deposited on the microring resonators. The third and fourth mirrors 541, 571 can be highly reflective broadband Bragg gratings, respectively etched in the silicon waveguides 540, 570.

The laser gain section 510 can be implemented as a stack of III-V semiconductor layers on a III-V substrate, heterogeneously integrated, epitaxial layers down, onto the silicon waveguide circuit using a wafer-bonding technique. After wafer-bonding, the III-V substrate is removed by mechanical grinding and eventually by etching until a stop layer. Various known bonding techniques can be used for this purpose. The bonding can be performed by molecular wafer-bonding (based on Van der Waals interactions between oxidized and hydrophilic surfaces) as disclosed e.g. in the article authored by A. W. Fang et al. entitled "A distributed feedback silicon evanescent laser", Optics Express, Vol. 16, Issue 7, pp. 4413-4419 (2008) or in the book authored by Q.-Y. Tong and U. Yösele entitled "Semiconductor wafer bonding" Wiley-V C H, Berlin, 1999. Alternately, the bonding can be achieved by adhesive bonding, using the thermosetting polymer divinylsiloxane-benzocyclobutene, also referred to as DVS-BCB, as a bonding agent. This adhesive bonding method has been described e.g. in the article by S. Keyvaninia et al. entitled "Demonstration of a heterogeneously integrated III-V/SOI single wavelength tunable laser", published in Optics Express, Vol. 21, Issue 3, pp. 3784-3792 (2013).

The laser gain section is advantageously a III-V waveguide bonded to the optical waveguide 520 with a thick bonding layer (typically between 50 and 300 nm). The III-V waveguide laterally confines the optical mode, while, longitudinally, two etched or cleaved facets, or large optical bandwidth Bragg gratings form the laser cavity. The III-V waveguide is electrically pumped to provide an optical gain to the laser structure.

At both ends of the laser gain section 510, an adiabatic coupler (not shown in the figure) transfers the optical mode to the underlying silicon optical waveguide 520. The adiabatic coupler is an inverted taper gradually transforming the lateral mode of the III-V waveguide into a lateral mode of the silicon optical waveguide. This adiabatic coupler can be implemented as a polymer waveguide abutted to the ends of the III-V waveguide as described in the article by G. Roelkens entitled "Laser emission and photodetection in an InP/InGaAsP layer integrated on and coupled to a silicon-on-insulator waveguide circuit" published in Optics Express, Vol. 14, Issue 18, pp. 8154-8159 (2006), herein incorporated by reference. Alternatively, the adiabatic coupler can be embodied by the silicon optical waveguide itself by gradually tapering its width to adiabatically transfer the III-V waveguide mode to a mode of the silicon optical waveguide. Such an adiabatic transfer by tapering the width of the silicon waveguide has been described in the article by B. B. Bakir et al. published in Optics Express, Vol. 19, Issue 11, pp. 10317-10325 (2011), herein incorporated by reference.

Optical feedback from the passive microring resonators 530, 560 is provided to the III-V gain section by the silicon optical waveguide 520, thereby selecting the one laser wavelength meeting the resonance conditions of the two microring resonators (as in a DBR laser).

As mentioned above, the laser gain section 510 can be implemented as a stack of III-V semiconductor epitaxial layers deposited on a III-V substrate.

For example, the epitaxial structure is deposited on an InP wafer and comprises a $p^+$-InGaAs contact layer, a p-InP cladding layer, a plurality of InGaAsP quantum wells surrounded by two non-intentionally doped InGaAsP separate confinement heterostructure (SCH) layers, and a thin n-InP cladding layer, facilitating the coupling with the silicon optical waveguide.

As another example, the epitaxial structure is deposited on an InP wafer and comprises a $p^+$-InGaAs contact layer, a p-InP cladding layer, a plurality of InGaAs/AlInGaAs quantum wells surrounded by two non-intentionally doped AlInGaAs separate confinement heterostructure (SCH) layers, and a thin n-InP cladding layer, facilitating the coupling with the silicon optical waveguide.

The above epitaxial structures implement a MQW (or multiple quantum well) laser also designated as Q-well laser. Alternatively, it is possible to envisage a multiple quantum wire (Q-wire), quantum dash (Q-dash), or quantum dot (Q-dot) laser instead.

Whatever the type of the laser, the epitaxial structure can be grown by metal-organic chemical vapor deposition (MOCVD), by molecular beam epitaxy (MBE), or by chemical beam epitaxy (CBE), as known to the man skilled in the art.

Figure 6:
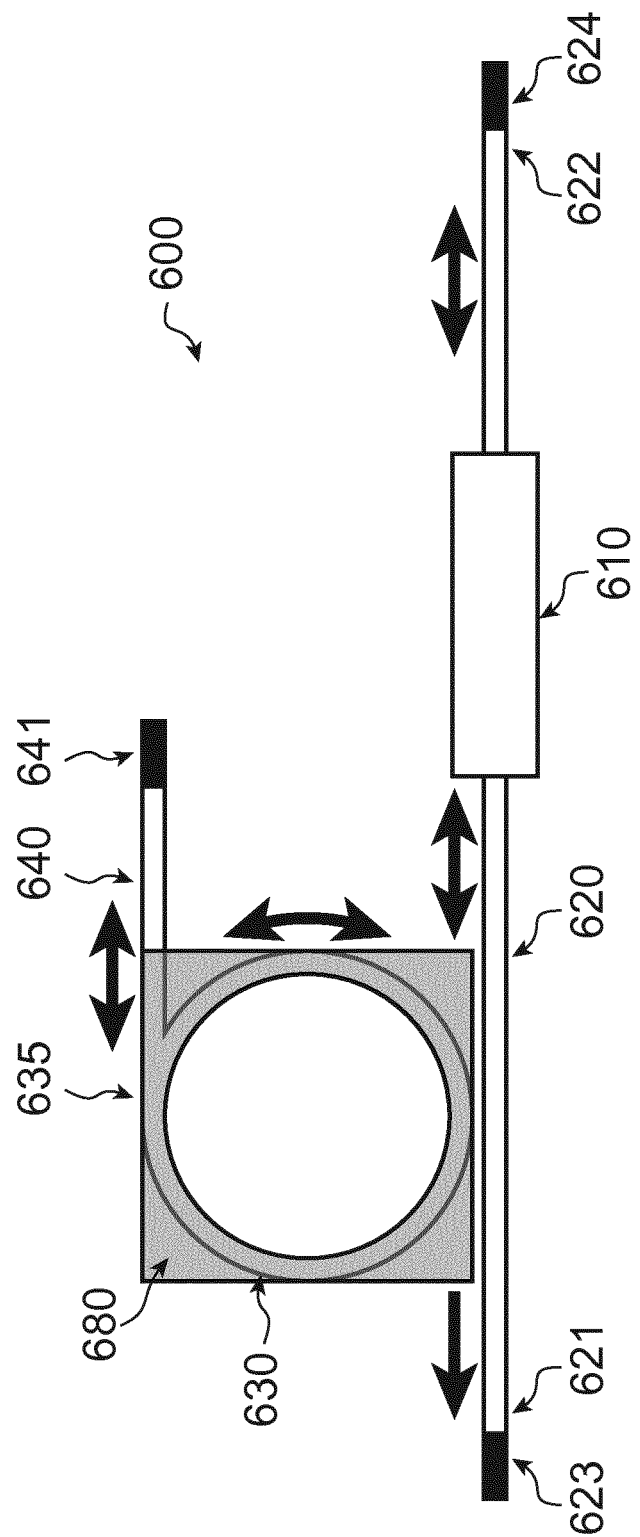
FIG. 6 schematically illustrates the structure of a single-WGF wavelength tunable semiconductor laser according to a second embodiment of the invention.

FIG. 6 schematically illustrates the structure of a single-WGF wavelength tunable semiconductor laser according to a second embodiment of the invention.

The illustrated semiconductor laser, 600, comprises a laser gain section, 610, performing an optical amplification. The detailed structure of this section is the same as described above in relation with FIG. 5.

The laser gain section 610 is optically coupled to an optical waveguide, 620, having a first end, 621 and a second end, 622, the laser light being output at both ends through a first mirror, 623, and a second mirror, 624, for example Bragg reflectors. A configuration in which one of the two mirrors 623 or 624 is highly reflective is also possible.

A passive microring resonator, 630, is located between the laser gain section 610 and the first end 621 of the optical waveguide 620. The microring resonator 630 is extended by an optical waveguide branch, 640, which is tangentially connected, 635, to the microring resonator 630, according to a whistle geometry.

The passive microring resonator may have the whistle geometry of FIG. 3 or FIG. 4.

The optical waveguide branch 640 is provided at its free (unconnected) end with a third mirror, 641, for example a highly reflective broadband Bragg reflector.

The optical waveguide branch 640 is preferably a straight branch.

The optical waveguide branch 640 is connected to the microring resonator 630 via a tangential connection, 635. By tangential connection, it is meant that the center line of the optical waveguide branch is aligned with a tangent to the mid-circle of the microring resonator. When the resonator 630 and the optical waveguide branch 640 are implemented by optical fibers, the core of the resonator is aligned and fused with the core of the optical waveguide branch. Off-axis tangential coupling is also possible, to provide a better matching between the modes of the straight waveguide 640 and the circular resonator 630. In the off-axis coupling, the peaks of the intensity distributions of the modes, rather than geometrical axes of the waveguides, are aligned.

The passive microring resonator 630 is evanescently coupled to the optical waveguide 620. By evanescent coupling, it is meant that the microring resonator is located close to the optical waveguide, so that an evanescent wave from the optical waveguide may enter the microring resonator and vice-versa.

The light wave emitted by the laser gain section 610, travelling towards the first end 621, is injected into the microring resonator 630 by evanescent coupling. The light wave thus injected travels clockwise in the microring resonator 630 and a part thereof is further injected into the optical waveguide branch 640 via the tangential connection 635. The wave injected into the optical waveguide branch 640 is reflected by the third mirror 641 back into the first microring resonator 630, where the reflected wave travels counterclockwise. A part of the reflected wave is injected by evanescent coupling into the optical waveguide 620 and fed back into the laser gain section 610.

The light wave emitted by the laser gain section 610, travelling towards the second end 622, is partially reflected by the second mirror 624 back into the optical waveguide 620 and fed back to the laser gain section 610.

The microring resonator 630 is preferably provided with ohmic heater, 680, configured to heat the microring resonator 630. It is therefore possible to vary the optical path length of the microring resonator 630 by controlling the current flowing through the heater, and hence to tune the wavelength of the laser. Alternatively, in particular when the microring resonator 630 is made of a semiconductor material (as silicon, for example), the optical path length of the microring resonator 630 can be varied by driving a current through it.

The laser structure depicted in FIG. 6 is preferably implemented according to a III-V/Si photonics technology.

In such instance, a silicon layer is deposited on top of a $SiO_2$ layer grown on a Si substrate. The optical waveguide 620, the passive microring resonator 630, including its branch extension 640, are patterned in the silicon layer to form a rib waveguide circuit.

The heater 680 can be implemented by a patch of metallic or resistive material deposited on the microring resonator 630. The third mirror 641 can be a highly reflective broadband Bragg grating, etched in the silicon waveguide 640.

The laser gain section 610 can be implemented in the same manner as that described for FIG. 5.

At both ends of the laser gain section 610, an adiabatic coupler (not shown in the figure) transfers the optical mode to the underlying silicon optical waveguide 620. The adiabatic coupler can be implemented in the same manner as that described for FIG. 5.

Optical feedback from the passive microring resonator 630 is provided to the III-V gain section by the silicon optical waveguide 620, thereby selecting the laser wavelengths meeting the resonance conditions of the microring resonator 630 and the optical cavity between the second mirror 624 and the microring resonator 630.

FIG. 7 schematically illustrates the structure of a tandem WGF/ring-resonator wavelength tunable semiconductor laser according to a third embodiment of the invention.

The illustrated semiconductor laser, 700, comprises a laser gain section, 710, performing an optical amplification. The detailed structure of this section is the same as described above in discussion of FIG. 5.

The laser gain section 710 is optically coupled to an optical waveguide, 720, having a first end, 721, and a second end, 722, the laser light being output at both ends through a first mirror, 723, and a second mirror, 724, for example Bragg reflectors. A configuration in which one of the two mirrors 723 or 724 is highly reflective is also possible.

An intermediate passive microring resonator, 760, is located between the laser gain section 710 and the first end 721 of the optical waveguide 720.

A second passive microring resonator, 730, is located in close proximity to the intermediate microring resonator 760, such that the two microring resonators are evanescently coupled. The second microring resonator 730 is extended by an optical waveguide branch, 740, which is tangentially connected to the second microring resonator 730 according to a whistle geometry. The optical waveguide branch 740 is provided at its free (unconnected) end with a third mirror, 741, for example a highly reflective broadband Bragg reflector.

The optical waveguide branch 740 is preferably a straight branch.

The optical waveguide branch 740 is connected to the second passive microring resonator 730 via a tangential connection, 735. By tangential connection, it is meant that the center line of the optical waveguide branch is aligned with a tangent to the mid-circle of the microring resonator. When the resonator 730 and the optical waveguide branch 740 are implemented by optical fibers, the core of the resonator is aligned and fused with the core of the optical waveguide branch. Off-axis tangential coupling is also possible, to provide a better matching between the modes of the straight waveguide 740 and the circular resonator 730. In the off-axis coupling, the peaks of the intensity distributions of the modes, rather than geometrical axes of the waveguides, are aligned. The second passive microring resonator 730 extended by the optical waveguide branch 740 is hereinafter referred to as WGF resonator.

The intermediate passive microring resonator 760 is evanescently coupled both to the optical waveguide 720 and to the second microring resonator 730. By evanescent coupling, it is meant that the intermediate passive microring resonator is located close to the optical waveguide (resp. the WGF resonator 730), so that an evanescent wave from the optical waveguide (resp. the WGF microring resonator) may enter the intermediate microring resonator and vice-versa.

According to a first variant, the intermediate passive microring resonator has a circular shape and the WGF microring resonator has the geometry of FIG. 3.

According to a second variant, the intermediate passive microring resonator has a racetrack shape and the second microring resonator has the geometry of FIG. 4.

The light wave emitted by the laser gain section 710, travelling towards the first end 721, is injected into the intermediate microring resonator 760 by evanescent coupling. The light wave thus injected travels clockwise in the intermediate microring resonator 760 and a part thereof is further injected into the WGF resonator 730, where it travels counterclockwise. A part of the light wave propagating counterclockwise in the WGF resonator 730 is then injected into the optical waveguide branch 740 via the tangential connection 735. The wave injected into the optical waveguide branch 740 is reflected by the third mirror 741 back into the WGF resonator 730, where the reflected wave travels clockwise. A part of the reflected wave is injected from the WGF resonator 730 into the intermediate microring ring resonator 760 via evanescent coupling, and propagates counterclockwise in the intermediate microring resonator 760. Furthermore, a part of the light propagating counterclockwise in the intermediate microring resonator 760 is injected by evanescent coupling into the optical waveguide 720 and fed back into the laser gain section 710.

The light wave emitted by the laser gain section 710, travelling towards the second end 722, is partially reflected by the second mirror 724 back into the optical waveguide 720 and fed back to the laser gain section 710.

The microring resonators 730 and 760 have preferably slightly different diameters and therefore exhibit different FSRs. The wavelength can therefore be selected by the Vernier effect, with only the wavelength corresponding to a match of the respective comb-like frequency responses being amplified.

The WGF and/or intermediate microring resonator(s) 730 and/or 760 is(are) preferably provided with ohmic heater(s), 780, and/or 790, configured to heat the microring resonator(s) 730 and/or 760. It is therefore possible to vary the optical path length(s) of either or both microring resonators by controlling the currents flowing through the respective heater(s), and hence to tune the wavelength of the laser. Alternatively, in particular when the microring resonators 730, 760 are made of a semiconductor material (as silicon for example), the optical path lengths of the microring resonators can be varied by driving a current through them.

The laser structure depicted in FIG. 7 is preferably implemented according to a III-V/Si photonics technology.

In such instance, a silicon layer is deposited on top of a $SiO_2$ layer grown on a Si substrate. The optical waveguide 720, the passive microring resonators 730, 760, including the branch extension of the latter, 740, are patterned in the silicon layer to form a rib waveguide circuit.

The heaters 780, 790 can be implemented by patches of metallic or resistive materials deposited on the microring resonators. The third mirror 741 can be a highly reflective broadband Bragg grating, etched in the silicon waveguide 740.

The laser gain section 710 can be implemented in the same manner as that described for FIG. 5.

At both ends of the laser gain section 710, an adiabatic coupler (not shown in the figure) transfers the optical mode to the underlying silicon optical waveguide 720. The adiabatic coupler can be implemented in the same manner as that described for FIG. 5.

Optical feedback from the passive microring resonator 760 is provided to the III-V gain section by the silicon optical waveguide 720, thereby selecting the one laser wavelength meeting the resonance conditions of the two microring resonators 730, 760 and the optical cavity between the second mirror 724 and the intermediate microring resonator 760.

The man skilled in the art will understand that further embodiments of the invention may be contemplated without departing from the scope of protection defined in the appended claims.

The invention claimed is:

1. A wavelength tunable semiconductor laser comprising a laser gain section (510,610,710), the laser gain section being optically coupled to an optical waveguide (520,620, 720) having a first end (521,621,721) and a second end (522,622,722), a first passive microring resonator (530,630, 730) being arranged between said first end and said laser gain section, characterized in that:
   the first passive microring resonator is extended by a first optical waveguide branch (540,640,740) tangentially connected thereto according to a whistle geometry, the first optical waveguide branch being provided with a first highly reflective broadband mirror (541,641,741) at its free end,
   the optical waveguide is provided with a first mirror (523,623,723) at its first end and with a second mirror (524,624,724) at its second end;
   the first microring resonator is evanescently coupled with the optical waveguide on a first side of the laser gain section to provide an optical feedback to the laser gain section; and
   an intermediate passive microring resonator (760) arranged between the first passive microring resonator and the optical waveguide, said intermediate passive microring resonator being evanescently coupled with the first passive microring resonator and the optical waveguide.

2. A wavelength tunable semiconductor laser according to claim 1, characterized in that the intermediate passive microring resonator is provided with a controllable heater (790).

3. A wavelength tunable semiconductor laser according to claim 1, characterized in that the first optical waveguide branch is configured as a straight branch.

4. A wavelength tunable semiconductor laser according to claim 1, characterized in that the first highly reflective broadband mirror is a Bragg grating.

5. A wavelength tunable semiconductor laser according to claim 1, characterized in that it further comprises a second passive microring resonator (560) arranged between said second end (522) and said laser gain section, the second passive microring resonator being extended by a second optical waveguide branch (570) tangentially connected thereto according to a whistle geometry, the second waveguide branch being provided with a second highly reflective broadband mirror (571) at its free end, the second passive microring resonator being evanescently coupled with the optical waveguide on a second side, opposite to the first side, of the laser gain section.

6. A wavelength tunable semiconductor laser according to claim 5, characterized in that the first and/or second passive microring resonator(s) is (are) provided with controllable heater(s) (580) and/or (590).

7. A wavelength tunable semiconductor laser according to claim 6, characterized in that the first and/or second passive microring resonator(s) has (have) racetrack geometry.

8. A wavelength tunable semiconductor laser according to claim 1, characterized in that at least one of the said optical waveguide ends is provided with an output mirror redirecting the light out of the waveguide.

9. A wavelength tunable semiconductor laser according to claim 1, characterized in that one of the said optical waveguide ends is provided with an output mirror redirecting the light out of the waveguide, whereas the other optical waveguide end is provided with a highly reflective broadband mirror.

10. A wavelength tunable semiconductor laser according to claim 5, characterized in that at least one of the said optical waveguide ends is provided with an output mirror redirecting the light out of the waveguide.

11. A wavelength tunable semiconductor laser according to claim 5, characterized in that one of the said optical waveguide ends is provided with an output mirror redirecting the light out of the waveguide, whereas the other optical waveguide end is provided with a highly reflective broadband mirror.

12. A wavelength tunable semiconductor laser comprising a laser gain section (510,610,710), the laser gain section being optically coupled to an optical waveguide (520,620, 720) having a first end (521,621,721) and a second end (522,622,722), a first passive microring resonator (530,630, 730) being arranged between said first end and said laser gain section, characterized in that:
the first passive microring resonator is extended by a first optical waveguide branch (540,640,740) tangentially connected thereto according to a whistle geometry, the first optical waveguide branch being provided with a first highly reflective broadband mirror (541,641,741) at its free end,
the optical waveguide is provided with a first mirror (523,623,723) at its first end and with a second mirror (524,624,724) at its second end;
the first microring resonator is evanescently coupled with the optical waveguide on a first side of the laser gain section to provide an optical feedback to the laser gain section;
the first and second passive microring resonators, including the first and second optical waveguide branches of said optical waveguide, constitute a pattern of silicon on a SiO$_2$ layer coating a Si substrate; and
the wavelength tunable semiconductor laser is implemented according to a III-V/Si technology.

13. A wavelength tunable semiconductor laser according to claim 12, characterized in that the laser gain section comprises a stack of epitaxial III-V layers deposited on a III-V substrate and bonded, epitaxial layers down, onto said pattern of silicon.

14. A wavelength tunable semiconductor laser according to claim 13, characterized in that the III-V epitaxial layers are bonded onto said pattern of silicon by molecular wafer bonding technique.

15. A wavelength tunable semiconductor laser according to claim 13, characterized in that the III-V epitaxial layers are bonded onto said pattern of silicon by adhesive bonding.

16. A wavelength tunable semiconductor laser according to claim 14, characterized in that the laser gain section is coupled to the optical waveguide by an inverted adiabatic silicon taper, the width of the silicon taper increasing from the laser gain section towards either end of the optical waveguide, said inverted adiabatic silicon taper transforming an optical mode of the laser gain section into an optical mode of the optical waveguide.

17. A wavelength tunable semiconductor laser according to claim 13, characterized in that the stack of epitaxial layers comprises a plurality of InGaAsP quantum wells surrounded by two InGaAsP separate confinement heterostructure layers.

18. A wavelength tunable semiconductor laser according to claim 13, characterized in that the stack of epitaxial layers comprises a plurality of InGaAs/AlInGaAs quantum wells surrounded by two AlInGaAs separate confinement heterostructure layers.

19. A wavelength tunable semiconductor laser according to claim 15, characterized in that the laser gain section is coupled to the optical waveguide by an inverted adiabatic silicon taper, the width of the silicon taper increasing from the laser gain section towards either end of the optical waveguide, said inverted adiabatic silicon taper transforming an optical mode of the laser gain section into an optical mode of the optical waveguide.

20. A wavelength tunable semiconductor laser comprising a laser gain section (510,610,710), the laser gain section being optically coupled to an optical waveguide (520,620, 720) having a first end (521,621,721) and a second end (522,622,722), a first passive microring resonator (530,630, 730) being arranged between said first end and said laser gain section, characterized in that:
the first passive microring resonator is extended by a first optical waveguide branch (540,640,740) tangentially connected thereto according to a whistle geometry, the first optical waveguide branch being provided with a first highly reflective broadband mirror (541,641,741) at its free end,
the optical waveguide is provided with a first mirror (523,623,723) at its first end and with a second mirror (524,624,724) at its second end;

the first microring resonator is evanescently coupled with the optical waveguide on a first side of the laser gain section to provide an optical feedback to the laser gain section;
the first passive microring resonator is provided with a controllable heater (580,680,780); and
an intermediate passive microring resonator (760) arranged between the first passive microring resonator and the optical waveguide, said intermediate passive microring resonator being evanescently coupled with the first passive microring resonator and the optical waveguide.

* * * * *